United States Patent
Ishiyama et al.

[11] Patent Number: 5,589,768
[45] Date of Patent: Dec. 31, 1996

[54] MAGNETORESISTANCE-EFFECT MAGNETIC SENSOR OF THE TEMPERATURE COMPENSATING TYPE

[75] Inventors: Noritaka Ishiyama, Tokyo; Koutarou Kobayashi, Yamanashi-ken, both of Japan

[73] Assignee: Mitsubishi Steel Mfg. Co., Ltd., Tokyo, Japan

[21] Appl. No.: 264,211

[22] Filed: Jun. 23, 1994

Related U.S. Application Data

[63] Continuation of Ser. No. 976,984, filed as PCT/JP91/01017, Jul. 30, 1991, abandoned.

[30] Foreign Application Priority Data

Jul. 30, 1990 [JP] Japan .................................. 2-199123
Dec. 25, 1990 [JP] Japan .................................. 2-412876

[51] Int. Cl.$^6$ ............... G01R 33/09; G01B 7/14; G11B 5/39; H01L 43/08
[52] U.S. Cl. .............. 324/207.21; 324/207.12; 324/252; 338/32 R; 341/15
[58] Field of Search .............. 324/207.12, 207.21, 324/207.24, 225, 235, 252; 341/15; 360/113; 338/32 R; 235/449, 450

[56] References Cited

U.S. PATENT DOCUMENTS

| | | | |
|---|---|---|---|
| 4,048,557 | 9/1977 | Chen | 324/252 X |
| 4,361,805 | 11/1982 | Narimatsu et al. | |
| 4,616,281 | 10/1986 | Nakamura | 324/252 X |
| 4,649,342 | 3/1987 | Nakamura | 324/252 X |
| 4,660,113 | 4/1987 | Nomura et al. | 324/252 X |
| 4,725,776 | 2/1988 | Onodera et al. | 324/252 X |
| 4,727,323 | 2/1988 | Zabler | 324/252 |

FOREIGN PATENT DOCUMENTS

| | | | |
|---|---|---|---|
| 54-41335 | 12/1979 | Japan . | |
| 55-432 | 1/1980 | Japan . | |
| 57-5067 | 1/1982 | Japan . | |
| 57-153483 | 9/1982 | Japan . | |
| 0117108 | 6/1985 | Japan | 324/207.21 |
| 61-091577 | 5/1986 | Japan . | |
| 212312 | 8/1989 | Japan | 324/207.21 |
| 1-265113 | 10/1989 | Japan . | |

OTHER PUBLICATIONS

JEE Journal of Electronic Engineering, No. 105, Aug. 1975, Tokyo JP pp. 34–38, Y. Makino "New Breed of Magnetoresistance Element Solves Magnetic Sensing Problems".

*Primary Examiner*—Gerard R. Strecker
*Attorney, Agent, or Firm*—Jordan and Hamburg

[57] ABSTRACT

A magnetoresistance-effect magnetic sensor provides an effective output even in atmospheres higher in temperature than those relevant to prior art sensors. The invented sensor has magnetoresistance-effect devices each connected to a constant current circuit. The voltage across each device is output as a magnetic sensitive output. With this structure, a temperature rise induced decrease in magnetoresistivity of the device is compensated for by an increase in intrinsic resistance thereof attributable to temperature rise. Thus, the sensor provides a reliable output even in high temperature atmospheres.

2 Claims, 5 Drawing Sheets

MAGNETORESISTANCE-EFFECT MAGNETIC SENSOR OF THE TEMPERATURE COMPENSATING TYPE

This application is a continuation, of application Ser. No. 07/976,984 filed as PCT/JP91/01017, Jul. 30, 1991, now abandoned.

The present invention relates to a magnetoresistance-effect magnetic sensor and, more particularly, to a magnetoresistance-effect magnetic sensor for use with magnetic encoders.

BACKGROUND OF THE INVENTION

Prior art magnetoresistance-effect magnetic sensors are disclosed illustratively in Japanese Patent Publication No. Sho 5067/1982 and in Japanese Patent Publication No. Sho 41335/1979, among others. As is well known, magnetoresistivity decreases in inverse proportion to temperature rise. For this reason, prior art magnetoresistance-effect magnetic sensors are not reliable at high temperatures. Illustratively, these sensors are incapable of yielding effective outputs in temperature ranges exceeding 70° C.

It is therefore an object of the present invention to provide a magnetoresistance-effect magnetic sensor that ensures an effective output in a high temperature atmosphere by compensating for the decrease in magnetoresistivity caused by temperature rise.

SUMMARY OF THE INVENTION

In order to achieve the above-mentioned object, there is provided a magnetoresistance-effect magnetic sensor having a magnetoresistance-effect device connected to a constant current circuit. The voltage across the device is taken as a magnetic sensitive output. The scheme is based on the inventor's findings that whereas the magnetoresistivity of the magnetoresistance-effect device decreases in inverse proportion to temperature rise, the intrinsic resistance of that device increases in direct proportion to temperature rise, and that the decrease in magnetoresistivity corresponds substantially to the increase in intrinsic resistance in numeric terms. Specifically, the constant current circuit causes a constant current to flow through the magnetoresistance-effect device so that the voltage correlative to that current will be output. With the decrease in magnetoresistivity offset by the increase in intrinsic resistance, the temperature factor of the sensor is substantially eliminated. As a result, the magnetoresistance-effect magnetic sensor of the invention ensures a highly reliable output even in high temperature atmospheres.

In a preferred structure according to the present invention, the magnetoresistance-effect magnetic sensor includes a plurality of magnetoresistance-effect devices. Where the magnetoresistance-effect magnetic sensor is utilized in an encoder, it is necessary to convert into a digital signal the magnetic sensitive output voltage signal that is output as a sine wave analog signal. Should temperature changes cause the zero point of the sine waves to fluctuate wider than the width of the magnetic sensitive output, complicated processing would be required for the analog-to-digital conversion. This potential difficulty is circumvented by utilizing at least one of the multiple magnetoresistance-effect devices for temperature compensation purposes. With the temperature compensating device paired with another device of the same type, the difference in output therebetween is monitored so as to eliminate from the former device's output the temperature factor associated with the intrinsic resistance of that device. This makes it possible to keep the zero point of the sine waves constantly at a predetermined reference value, whereby the analog-to-digital conversion is accomplished easily.

PREFERRED EMBODIMENTS OF THE PRESENT INVENTION

Figure 5:
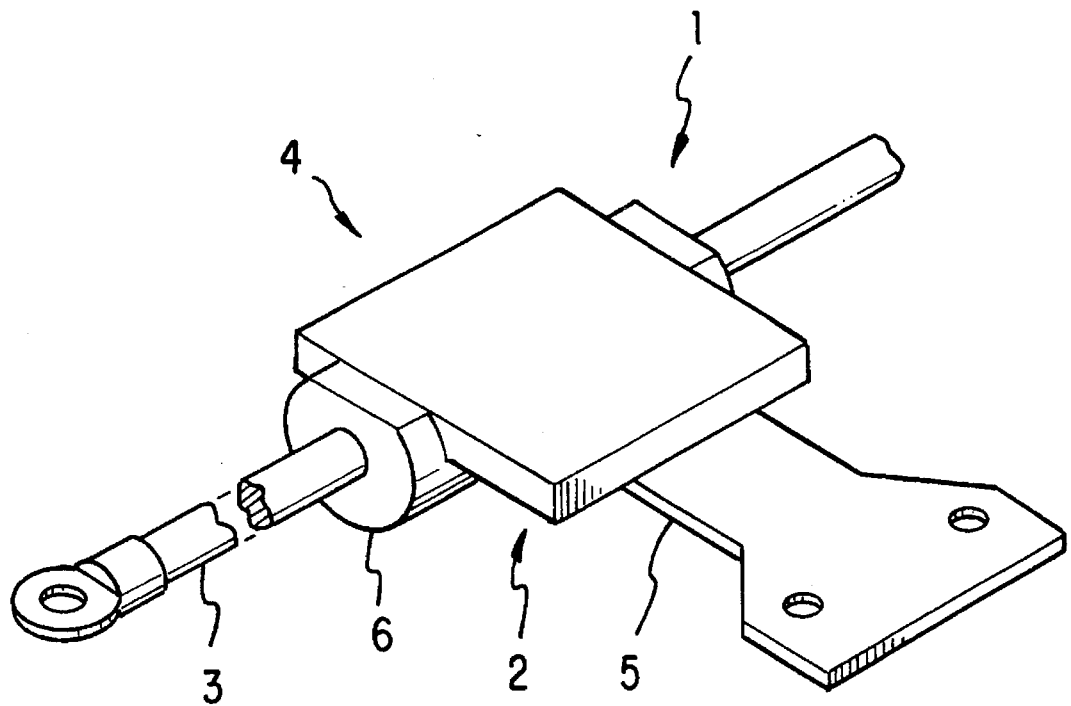
FIG. 5 is a perspective view of a linear encoder utilizing the preferred embodiment of the present invention.

A preferred embodiment of the invention will now be described with reference to the accompanying drawings. A magnetoresistance-effect magnetic sensor embodying the present invention is used illustratively in a linear encoder 1 shown in FIG. 5, the sensor taking part in positioning control over the printer head of a dot matrix printer. The linear encoder 1 comprises a detecting head 2 which is the magnetoresistance-effect magnetic sensor and a round rod type magnetic medium 3.

Figure 4:
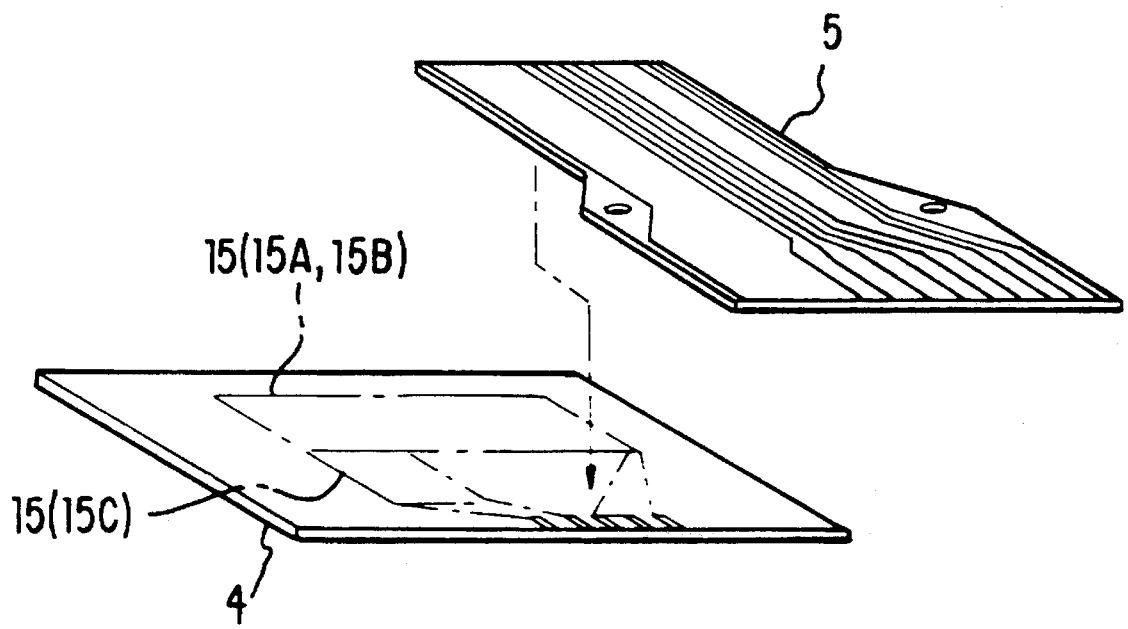
FIG. 4 is a perspective view showing how the detecting portion is related to a lead portion in a detecting head of the preferred embodiment.
Figure 6:
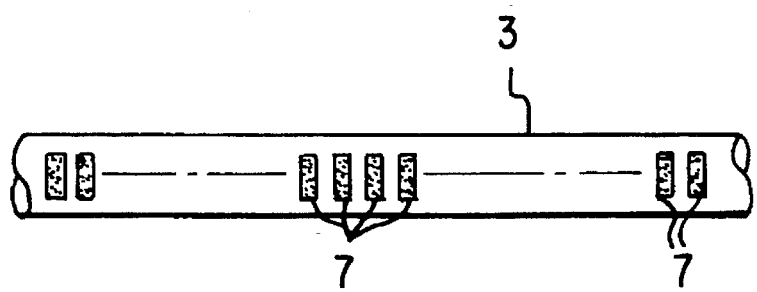
FIG. 6 is a plan view of a magnetic medium used in the preferred embodiment.
Figure 7:
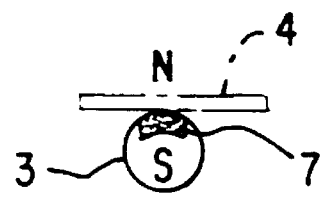
FIG. 7 is a side view of the magnetic medium used in the preferred embodiment.

The detecting head 2 comprises a detecting portion 4 shown in FIG. 4 and a lead portion 5 for connecting the detecting portion 4 to a controller, not shown. The detecting portion 4 is coupled to a guide cylinder 6 (FIG. 5) that moves the detecting portion 4 along the magnetic medium 3. The round rod type magnetic medium 3 (FIG. 6) has numerous magnetic parts 7 magnetized thereon and spaced apart at predetermined intervals. The detecting head 2 detects the magnetism of the magnetic parts 7 as it moves along the magnetic medium 3, and outputs a signal accordingly. As depicted in FIG. 7, the magnetic parts 7 of the magnetic medium 3 are magnetized in the perpendicular direction.

Figure 2:
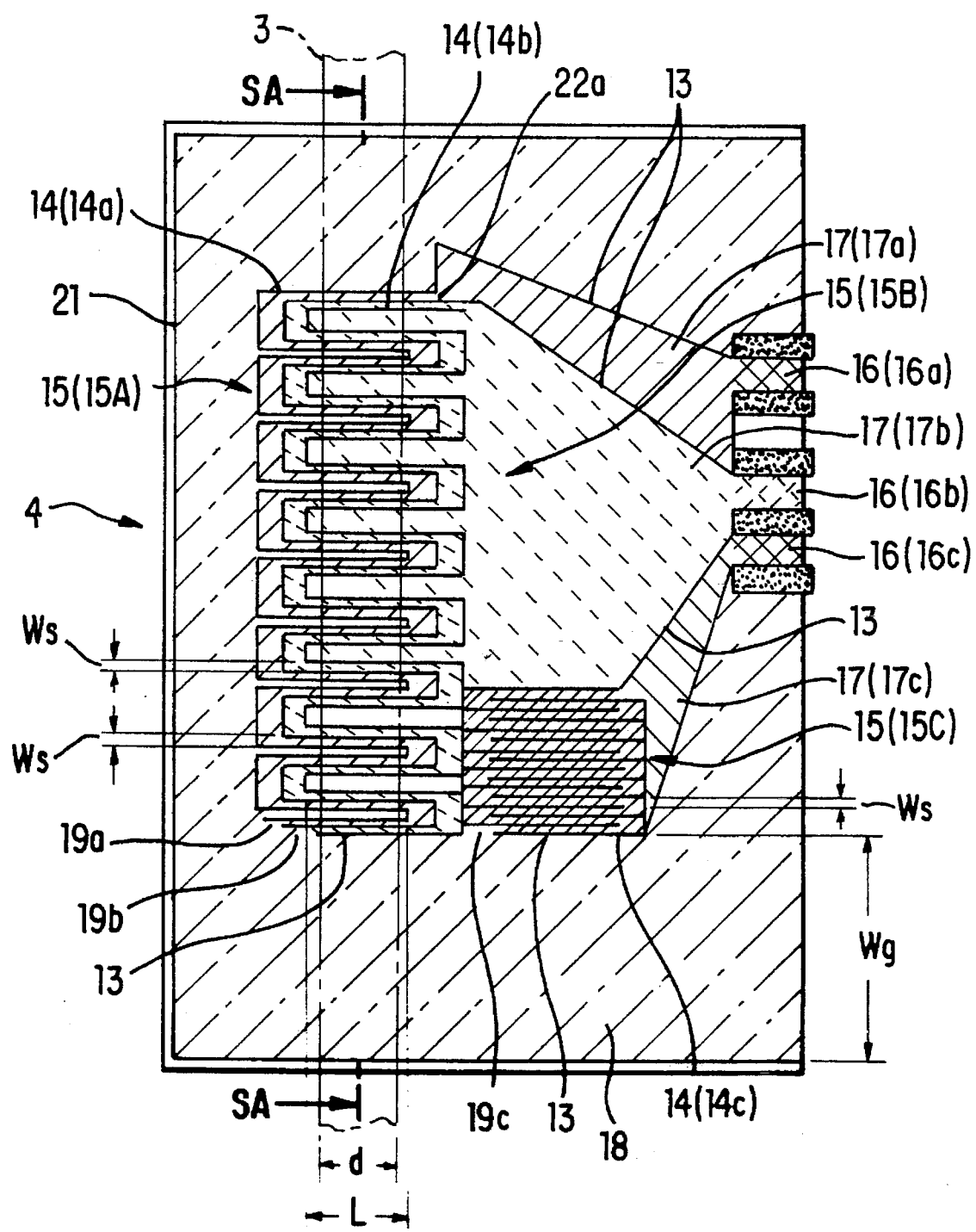
FIG. 2 is a plan view of a detecting portion of the preferred embodiment in FIG. 1.
Figure 3:
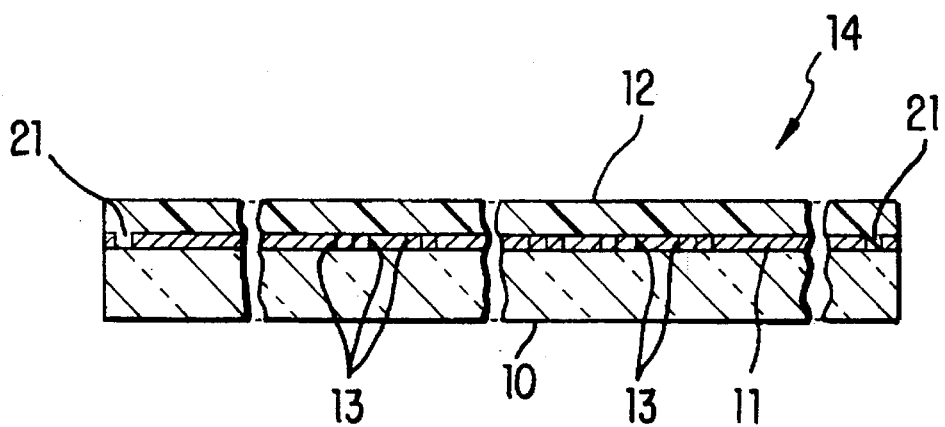
FIG. 3 is a cross-sectional view taken on line SA—SA in FIG. 2.

As shown in FIG. 3, the detecting portion 4 has a thin film layer 11 formed with a thickness of about 1 μ on a glass substrate 10, the layer 11 being made of a magnetoresistance-effect material such as permalloy, Fe—Ni alloy system. The thin film layer 11 is covered with a protective layer 12 illustratively made of a synthetic resin such as polyether amide. Fine insulation lines 13 are engraved by laser beam on the thin film layer 11. This arrangement forms three devices 15 (15A, 15B, 15C) having zigzag pattern current paths 14 (14a, 14b, 14c), as illustrated in FIG. 2. Lead paths 17 (17a, 17b, 17c) are provided to connect the current paths 14a, 14b and 14c of the devices 15A, 15B and 15C to terminal portions 16 (16a, 16b, 16c), respectively. Around these portions is a ground 18 having a sufficiently wide area.

One reason for having the devices 15 surrounded by the wide ground 18 is to prevent noise. Another reason is to ensure a sufficient grounding capacity of currents in a constant current structure to be discussed later. The ground 18 provides an extensive equipotential zone that prevents currents induced by external noise from reaching and adversely affecting the devices 15, whereby the resistance to noise is significantly enhanced.

The noise preventing capability is implemented in part by joining the ends 19a, 19b and 19c of the devices 15A, 15B and 15C directly to the ground 18, as illustrated. In the constant current structure, relatively large currents continue to flow and tend to promote ground corrosion. According to the present invention, the wide area ground 18 effectively prevents such corrosion.

Preferably, the sum of the minimum widths Ws of the current paths 14a, 14b and 14c (i.e., 3 Ws) for the three devices 15A, 15B and 15C should be in the following relationship with respect to the width Wg of a major current path Wg of the ground 18:

$$Wg \geq (3Ws)^2$$

Moisture removing fine grooves 21 are formed continuously along three of the four sides of the ground 18, as shown in FIGS. 2 and 3. The grooves 21 engage with the protective layer 12 by capturing the latter inside. This structure is intended to make doubly sure to prevent the entry of moisture into the thin film layer 11.

More specifically, edges of the thin film layer 11 would admit moisture if left exposed to the outside. The infiltrating moisture would corrode the thin film layer 11, degrading the insulating capability thereof over time. To prevent such corrosion and subsequent insulation breakdown requires having the edges of the thin film layer 11 covered securely with the protective layer 12 or with some other suitable synthetic resin. However, covering the very narrow edges of the thin film layer 11 is a surprisingly difficult task to accomplish. The difficulty is circumvented by having the protective layer 12 fit into the moisture removing grooves 21 as described. This provides a secure coating over the edges of the thin film layer 11, preventing the entry of moisture thereinto.

The device 15A is patterned so that the insulation lines 13 will expand perpendicularly outside at the junction between lead path connecting end 22a and lead path 17a. This scheme is adopted for the following reason: if the insulation lines 13 forming the zigzag pattern of the device 15A were allowed to extend unmodified to form lead paths, the resulting resistance of the device 15A would become greater than that of the other device 15B or 15C. Patterned as it is, the device 15A has a resistance value comparable to that of the device 15B or 15C.

Figure 1:
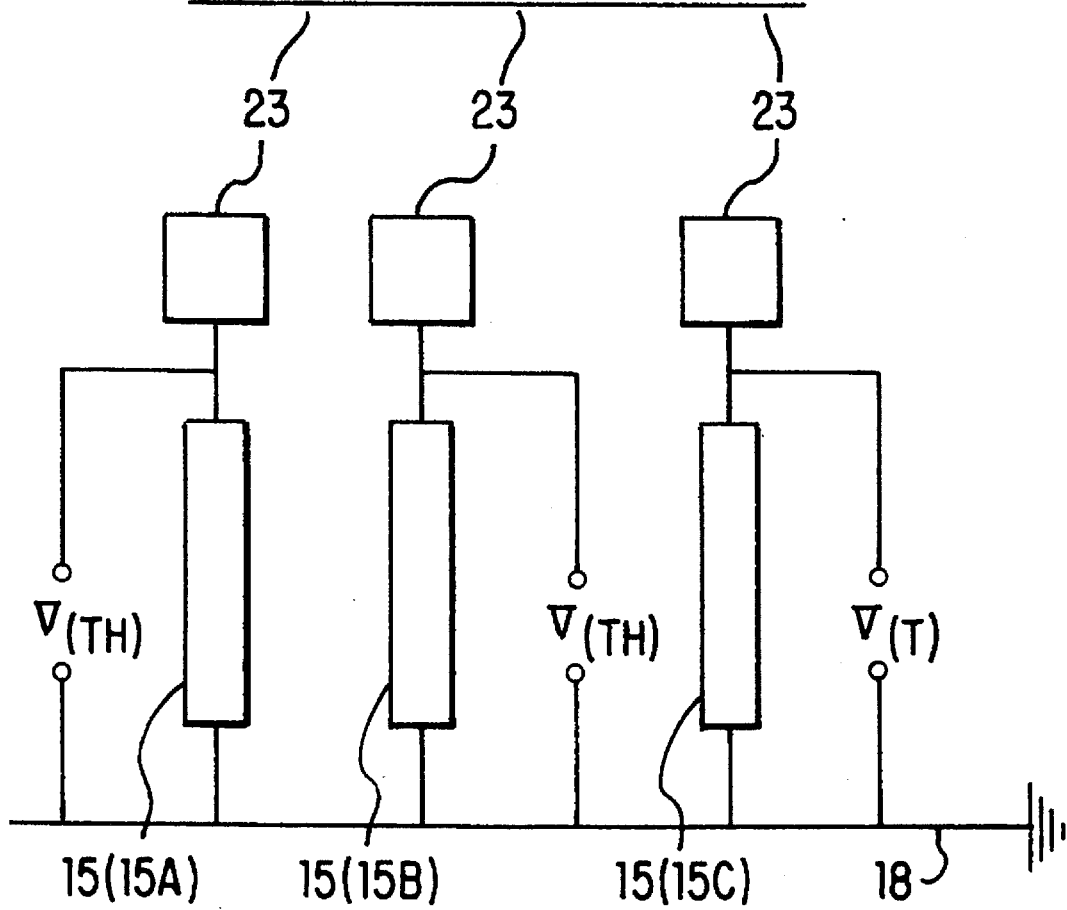
FIG. 1 is a circuit diagram of a magnetoresistance-effect magnetic sensor embodying the present invention.

As shown in FIG. 1, the ends on one side of the three devices 15A, 15B and 15C are connected to constant current circuits 23, and the ends on the other side of the devices are connected commonly to the ground 18. Thus, a constant current i flows through each device. Changes in voltage across each device are detected and output as magnetic detection information.

In the above setup where the constant current circuits 23 cause the constant current i to flow through the devices 15, changes in voltage across each device are detected to provide an out put that varies with magnetism, so that the decrease in magnetoresistivity of the device due to temperature rise will be compensated. As a result, the magnetoresistance-effect magnetic sensor according to the present invention ensures an effective output even in high temperature atmospheres in which the performance of prior art magnetoresistance-effect magnetic sensors is unpredictable. More specifically, the magnetic detection and the compensation take place as follows:

As mentioned, it is known that the magnetoresistivity S of the magnetoresistance-effect device decreases in response to temperature rise, and that the intrinsic resistance RT of the device, i.e., the resistance in effect when the device is free from the effect of magnetic fields in an atmosphere of temperature T, increases in keeping with the temperature rise. When experiments were conducted in connection with the invention, data were taken on the rate Ks of decrease of the magnetoresistivity S and on the rate KT of increase of the intrinsic resistance RT. It turned out that $$Ks = |0.223\%/°C.$$

and that $$KT = 0.221\%/°C.$$

It is these findings that led to the concept of compensating for the loss in magnetoresistivity with respect to temperature rise.

The resistance R(TH) of a device under the effect of a magnetic field H in an atmosphere of a temperature T is given as $$R(TH) = R_0 + \Delta RT + \Delta RH = RT + \Delta RH$$

where, $R_0$ is the reference resistance of the device, i.e., the resistance in effect in an atmosphere of reference temperature free of magnetic field effects; $\Delta RT$ is the amount of increase in device resistance due to temperature rise; $\Delta RH$ is the amount of increase in device resistance due to magnetoresistance-effect; and RT is the intrinsic resistance of the device in an atmosphere of a given temperature T.

Thus, the voltage V(TH) across the device is given as $$V(TH) = R(TH) \cdot i = (RT + \Delta RH) \cdot i$$

where i is electric current and the magnetic sensitive output $\Delta V(TH)$ is expressed as $$\Delta V(TH) = \Delta RH \cdot i$$

The value $\Delta RH$ providing the basis for the magnetic sensitive output $\Delta V(TH)$ is given as $$\begin{aligned}\Delta RH &= S \cdot RT \\ &= S_0(1 + KS \cdot T) \cdot R_0(1 + KT \cdot T) \\ &= S_0 \cdot R_0(1 + KS \cdot T)(1 + KT \cdot T) \\ &= S_0 \cdot R_0(1 + KS \cdot T + KT \cdot T + KS \cdot KT \cdot T^2)\end{aligned}$$

where, $S_0$ is the magnetoresistivity of the device in the reference temperature atmosphere and S is magnetoresistivity. Since the square term $Ks \cdot KT \cdot T^2$ is negligible, one gets the relation:

$$\Delta RH = S_0 \cdot R_0(1 + (Ks + KT)T)$$

Because $Ks \approx -KT$ as mentioned, one eventually arrives at:

$$\Delta RH = S_0 \cdot R_0$$

That is, $\Delta RH$ is independent of temperature. Thus the magnetic sensitive output $\Delta V(TH)$ is also free of the influence of temperature.

The significance of the point above is emphasized further by comparison with the output from what is disclosed in the abovementioned Japanese Patent Publication No. Sho 5067/ 1982. The disclosed prior art technique provides the output ΔV using the following expression:

$$\Delta V = -(\Delta\rho/4\rho o) \cdot \cos 2\theta \cdot V_0$$

where, Δρ in the above expression corresponds to ΔRH of the present invention. The value Δρ is free from the influence of temperature for the same reason as described above. However, the intrinsic resistance ρo, i.e., the resistance in effect with no magnetic field applied, increases at the temperature T according to the relation:

$$\rho o(T) = \rho_o(1 + KT \cdot T)$$

As a result, the output ΔV drops. This means that unlike the present invention, the prior art technique affords no temperature compensating effect.

Of the three devices 15A, 15B and 15C, two (15A, 15B) are used for magnetic detection purposes. The zigzag patterns of the devices 15A and 15B are designed to dovetail together and are shifted 90 degrees with respect to the magnetized pattern of the magnetic medium 3. This is a technique used frequently with encoders: which of the two devices yields its output earlier than the other determines the direction in which the detecting head 2 moves. Thus the two devices 15h and 15B provide their outputs separately as shown in FIG. 1.

The length L of each of the devices 15A and 15B is made 1 to 1.5 times the diameter of the magnetic medium 3. This length is obtained empirically as one that maximizes the magnetic sensitivity of the devices 15A and 15B with respect to the round rod type magnetic medium 3. Generally, the magnetic sensitivity of the devices 15 is maximized when the length L thereof is in a constant relationship with regard to the magnetic field width of the magnetic parts 7 of the magnetic medium 3. That relationship would be acquired easily through calculations if the magnetic medium were a rectangular type rod whose magnetic parts are formed in a straight line. As it is, the round rod type magnetic medium 3 is not germane to known techniques for calculating the above relationship. Thus, the inventor repeated experiments with devices of various lengths and came up with the finding that the devices provide their maximum magnetic sensitivity when their length is 1 to 1.5 times the diameter of the magnetic medium 3.

The remaining device 15C is used exclusively for temperature compensating purposes; the device when used in combination with an encoder makes it easier for the encoder to output necessary digital waveforms. The intrinsic resistance of the device 15C is the same as that of the device 15A or 15B. When constructed, the device 15C is located as close to the devices 15A and 15B as possible so that the three devices will exist together in the atmosphere of the same temperature as much as possible.

The significance of the temperature compensation achieved by the device 15C lies in this: that the temperature factor ΔRT associated with the intrinsic resistance ($RT = R_0 + \Delta RT$) for the magnetism detecting devices 15A and 15B is removed by monitoring the difference between the devices 15B and 15C in terms of their output, with no complicated calculations performed.

More specifically, the difference between the output V(TH) of the device 15A (or 15B) and the output V(T) of the device 15C is obtained as follows:

$$\begin{aligned} V(TH) - V(T) &= (R_0 + \Delta RT + \Delta RH) \cdot i - (R_0 + \Delta RT) \cdot i \\ &= i(R_0 + \Delta RT + \Delta RH - R_0 - \Delta RT) \\ &= i \cdot \Delta RH \end{aligned}$$

Removing (i.e., compensating for) ΔRT from the output leaves ΔRH alone which is the net change in resistance caused by magnetism. As a result, the analog-to-digital conversion for obtaining the encoder output becomes easier to accomplish, as mentioned earlier.

The device 15C is used only for temperature compensation and not for magnetism detection for a particular reason: to help meet the requirements specific to printer head positioning control. In general, it is not mandatory to utilize such means as the device 15C exclusively for temperature compensating purposes.

Figure 8:
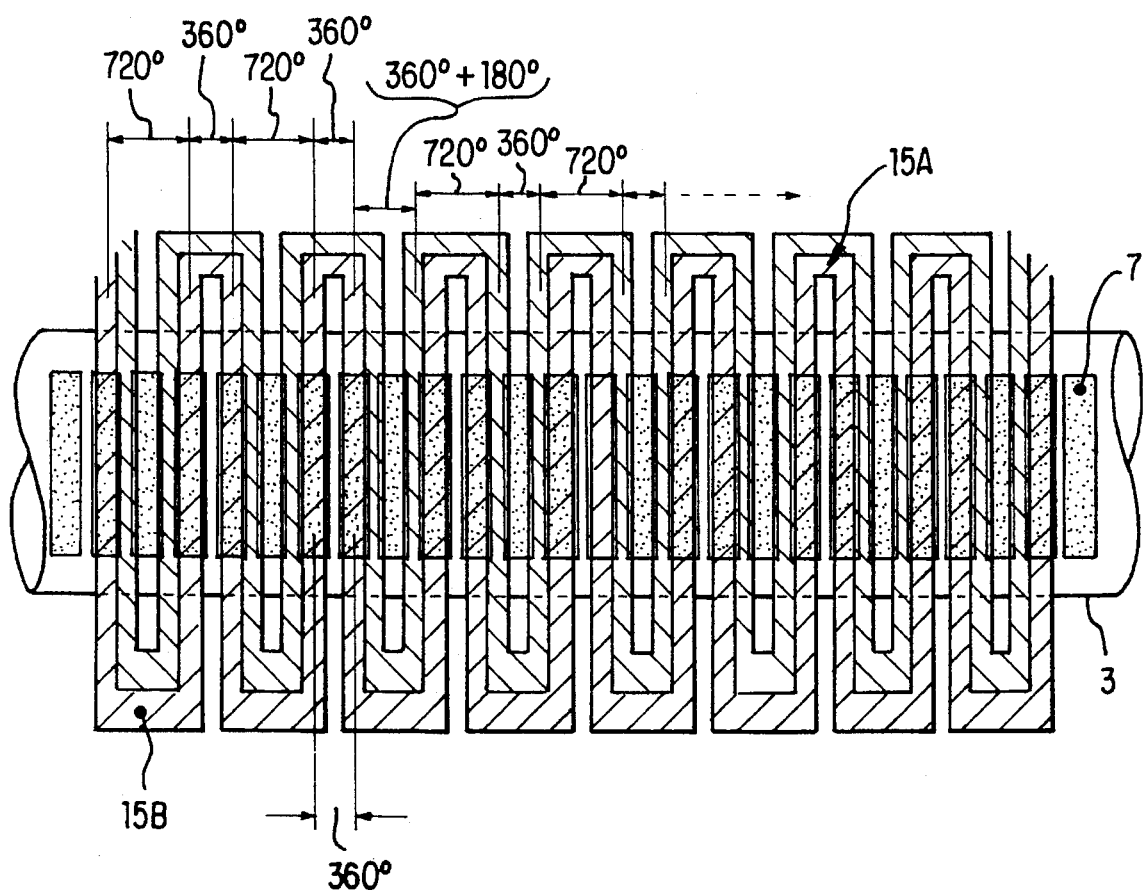
FIG. 8 is a plan view of the serpentine line pattern of the present invention, omitting the substrate for clarity, depicting the alignment of the serpentine line patterns with respect to a magnetic pattern of a magnetic medium.

Referring to FIG. 8, each of the plurality of devices furnished may be used for magnetism detecting purposes. In that case, the temperature compensation is accomplished by first shifting a pair of devices 180 degrees, or odd integer multiples of 180°, with respect to the magnetized pattern. For instance, the arranged pattern of the magnetic parts 7 forms alternating north and south poles along the magnetic pattern which are detected by the devices 15A and 15B. Devices 15a and 15b are shifted an odd multiple of 180°, as determined by the magnetic pattern of the magnetic medium, with respect to each other. The difference D in output between the devices 180 degrees apart is given as $$D = (R_0 + \Delta RT + \Delta RH) \cdot i - (R_0 + \Delta RT - \Delta RH) \cdot i = i \cdot 2\Delta RH$$

Thus ΔRT is removed from the output. Here, the net change in resistance due to magnetism is doubled, whereby the output of the sensor is made higher than has been conventionally possible.

INDUSTRIAL FIELD OF THE INVENTION

The magnetoresistance-effect magnetic sensor according to the present invention has a magnetoresistance-effect device supplied with a constant current, and a voltage occurring across the device in correlation to that constant current is output. The scheme compensates for the decrease in magnetoresistance-effect due to temperature rise, allowing the sensor to provide an effective output even in atmospheres higher in temperature than those germane to prior art magnetoresistance-effect magnetic sensors. Thus, the present invention when embodied as described makes the scope of applications for magnetic sensors wider than ever before.

What is claimed is:

1. A magnetoresistance-effect magnetic sensor for sensing a magnetic pattern on a magnetic medium comprising:

at least first and second devices having respective first and second current paths each with first and second ends, said first and second devices being formed in a magnetoresistance-effect thin film layer;

said thin film layer of said first and second devices consisting essentially of a Fe-Ni alloy having a rate of decrease of the magnetoresistance-effect with temperature and a rate of increase of intrinsic resistance with temperature that are substantially equal;

said first and second devices being arranged in 180 degree shifted positions with respect to the magnetic pattern to be detected such that said first device senses a first portion of the magnetic pattern and said second device senses a second portion of the magnetic pattern wherein the second portion is 180° out of phase with respect to the first portion as determined by a periodicity of the magnetic pattern;

first and second constant current sources, each serially connected to first ends of said first and second devices respectively to supply constant currents therethrough and to generate respective first and second potentials across said first and second devices, said first device and first constant current source and said second device and second current source being arranged in parallel with said second ends of said first and second devices connected to a common potential, wherein a difference between said first and second potentials is compensated for temperature effects and varies in accordance with said magnetic pattern.

2. The device according to claim 1 wherein said first and second current paths are arranged adjacent each other in a substantially serpentine pattern for positioning above the magnetic pattern.

* * * * *